(12) United States Patent
Pearson et al.

(10) Patent No.: US 9,030,824 B2
(45) Date of Patent: May 12, 2015

(54) DIELECTROPHORETIC COOLING SOLUTION FOR ELECTRONICS

(71) Applicant: Hamilton Sundstrand Corporation, Windsor Locks, CT (US)

(72) Inventors: Matthew Robert Pearson, Hartford, CT (US); Brian St. Rock, Andover, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 295 days.

(21) Appl. No.: 13/633,167

(22) Filed: Oct. 2, 2012

(65) Prior Publication Data

US 2014/0092551 A1    Apr. 3, 2014

(51) Int. Cl.
*H01L 23/34* (2006.01)
*G06F 1/20* (2006.01)
*H01L 23/473* (2006.01)
*H05K 7/20* (2006.01)
*F28F 7/00* (2006.01)

(52) U.S. Cl.
CPC .............. *G06F 1/20* (2013.01); *H05K 7/20272* (2013.01); *H05K 7/20254* (2013.01); *H05K 7/20327* (2013.01); *H05K 7/20936* (2013.01); *H01L 23/473* (2013.01); *G06F 2200/201* (2013.01); *H01L 2924/0002* (2013.01)

(58) Field of Classification Search
CPC .......... H05K 7/20218; H05K 7/20254; H05K 7/20263; H05K 7/20272; H05K 7/20936; H05K 7/20327; H01L 23/473; H01L 2924/0002; G06F 1/20; G06F 2200/201

USPC ........... 361/679.46–679.54, 688–723; 165/80.4–80.5, 104.33; 257/714–715; 174/15.1; 417/48, 50, 118

See application file for complete search history.

(56) References Cited

U.S. PATENT DOCUMENTS

| | | |
|---|---|---|
| 5,632,876 A | 5/1997 | Zanzucchi et al. |
| 5,769,155 A | 6/1998 | Ohadi et al. |
| 5,788,819 A | 8/1998 | Onishi et al. |
| 6,149,789 A | 11/2000 | Benecke et al. |
| 6,260,579 B1 | 7/2001 | Yokota et al. |
| 6,443,704 B1 | 9/2002 | Darabi et al. |

(Continued)

FOREIGN PATENT DOCUMENTS

WO    2006016293 A1    2/2006

OTHER PUBLICATIONS

M. Lackowski, A. Krupa, D. Butrymowicz, "Dielectrophoresis flow control in microchannels", Aug. 5, 2013, Journal of Electrostatics 71 (2013) 921-925.*

(Continued)

*Primary Examiner* — Zachary M Pape
(74) *Attorney, Agent, or Firm* — Carlson, Gaskey & Olds, PC

(57) ABSTRACT

At least one cooling channel is positioned adjacent to an electronic component. The cooling channel communicates with plenums at each of two opposed axial ends. A dielectric fluid is received in the cooling channel. The cooling channel is provided with at least one electrode. A potential is applied to the at least one electrode such that an electric field magnitude at the downstream end of the channel is less than an upstream electric field magnitude, and such that a dielectrophoretic force on a bubble in the cooling channel will force it downstream.

18 Claims, 1 Drawing Sheet

(56) References Cited

U.S. PATENT DOCUMENTS

| | | | |
|---|---|---|---|
| 7,108,056 B1 * | 9/2006 | Moghaddam et al. | 165/201 |
| 7,497,594 B2 | 3/2009 | Nagarekawa et al. | |
| 7,929,305 B1 | 4/2011 | Pal | |
| 8,053,938 B2 | 11/2011 | Pal et al. | |
| 8,171,745 B2 | 5/2012 | Schroder | |
| 8,308,926 B2 * | 11/2012 | Liu et al. | 204/643 |
| 2008/0101022 A1 * | 5/2008 | Cernasov | 361/699 |
| 2014/0092558 A1 * | 4/2014 | Pearson | 361/699 |

OTHER PUBLICATIONS

S. Wang, J. Bryan, "Modeling Dielectrophoretic Force Induced Bubble Motion in Micro-Channels", Nov. 5, 2006, IMECE 2006-16225 pp. 789-798.*

European Search Report for European Application No. 13186884.6 received Dec. 11, 2014.

* cited by examiner

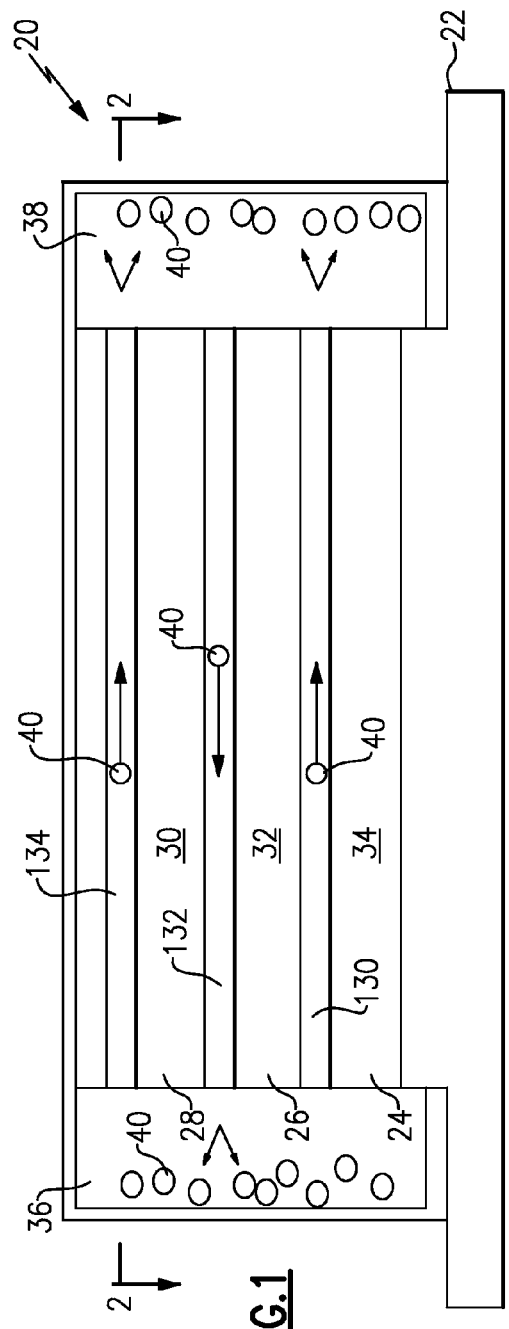
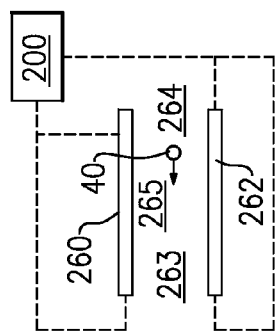
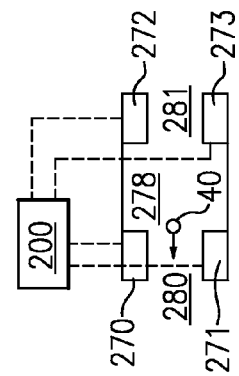
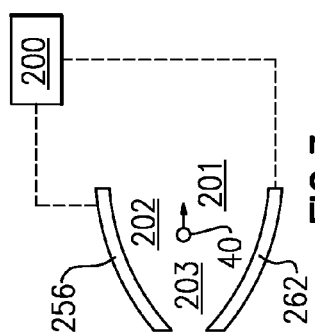
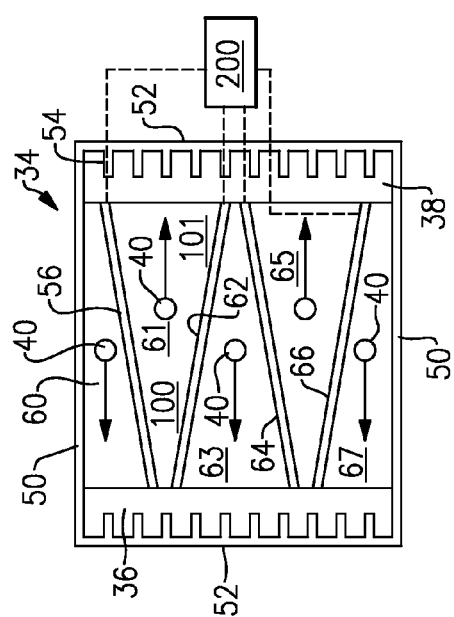

DIELECTROPHORETIC COOLING SOLUTION FOR ELECTRONICS

BACKGROUND OF THE INVENTION

This application relates to the use of dielectrophoretic forces to cool electronic components.

The thermal management of electronics presents a large and growing challenge. High power density electronics result in an increase in the heat flux generated by electronic devices, such that passive cooling may no longer be sufficient. Thermal management limitations are beginning to present a ceiling from electronics reaching full capacity.

As an example, clock speeds on central processing units have been reduced, and the power rating for power electronic components has been restricted. The theoretical operating limits of the electronic devices far exceed what is possible to implement with present cooling solutions.

Fluid pumping has been proposed, however, most mechanical pumps raise reliability issues, and can introduce noise, vibration and other challenges.

Dielectrophoretic pumping is known, and has been proposed for some applications in cooling electronics. A dielectrophoretic force is generally provided by varying an electrical response relative to a bubble which is formed in a dielectric fluid. In general, the dielectric fluid in a liquid state behaves in one way relative to a dielectrophoretic force, but a bubble of vapor will react in a distinct manner.

SUMMARY OF THE INVENTION

At least one cooling channel is positioned adjacent to an electronic component. The cooling channel communicates with plenums at each of two opposed axial ends. A dielectric fluid is received in the cooling channel. The cooling channel is provided with at least one pair of electrodes. A voltage potential is applied to the at least one electrode pair such that an electric field magnitude at the downstream end of the cooling channel is less than an upstream electric field magnitude, and such that a dielectrophoretic force on a bubble in the cooling channel will force it downstream.

These and other features of this application will be best understood from the following specification and drawings, the following of which is a brief description.

BRIEF DESCRIPTION OF THE DRAWINGS

FIG. 1 shows an electronic stack.
FIG. 2 is a cross-sectional view along line 2-2 of FIG. 1.
FIG. 3 shows an alternative embodiment.
FIG. 4 shows yet another embodiment.
FIG. 5 shows yet another embodiment.

DETAILED DESCRIPTION

FIG. 1 shows a stack 20 that mounts a plurality of electronic controls or cores 30, 32 and 34. On the other hand, this application would extend to a single cooling layer cooling a single control element. As disclosed, these may be electronic control elements, such as central processing units or power controllers, or any other component that requires cooling. The cores 30, 32, 34 are all generally planar.

Micro-channel cooling channels are defined at 130, 132 and 134, and intermediate the cores 30, 32, and 34. In a sense, the channels 130, 132, 134 and cores 30, 32, 34 are stacked in a direction generally perpendicular to the planar shape of the cores 30, 32, 34. Of course, the cores 30, 32, 34 are not actually planar.

End plenums 36 and 38 are defined at axial ends of the cooling channels 130, 132 and 134. A cold plate 22 is placed adjacent a lower most one of the cores 24, and operates to tap heat away. Another type heat sink can replace cold plate 22.

As shown in FIG. 1, bubbles 40 may be formed in a cooling liquid which is received in the cooling passages 130, 132 and 134 and the plenums 36 and 38. A dielectric cooling fluid, as known, is utilized. When such fluids are heated, as they will from the heat generated by the cores 30, 32 and 34, bubbles 40 will form in the liquid.

As is clear from FIG. 2, the cooling channels 130, 132, 134 as disclosed are actually formed of a plurality of sub-channels 60, 61, 63, 65, 67 aligned in a lateral direction, such that adjacent ones of the cooling sub-channels move bubbles in opposed directions. While plural sub-channels are disclosed, it is within the scope of this invention that a single channel be used.

As shown in FIG. 2, one of the cooling channels 134 includes an internal electrode 56 defining a sub-channel 60 with one outer wall 50. The outer wall 50 either contains an electrode or acts as one. An internal sub-channel 61 is defined between electrodes 56 and 62. An internal sub-channel 63 is defined between electrodes 62 and 64. An internal sub-channel 65 is defined between electrodes 64 and 66, and a sub-channel 67 is defined between electrode 66 and another outer wall 50 that may contain an electrode, or act as one. The voltage applied to the walls/electrode 50 may differ from their paired electrodes 56 and 66 to create an electric field, as described below. As can be seen, the electrodes 56, 62, 64 and 66 extend in non-parallel directions relative to each other such that each of the sub-channels 60, 61, 63 and 65 and 57 decreases in flow cross-sectional area in one direction. A control/voltage source 200 applies an appropriate voltage to the electrodes.

Stated another way, cooling channels 130, 132 and 134 are provided with a plurality of electrodes, with adjacent ones of the electrodes extending in a non-parallel direction along an axial direction between the plenums 36 and 38. Adjacent electrodes (56 and 62 for example) extend in a direction with an axial component, and a lateral component, and with the lateral component from one adjacent electrode being opposed to a lateral component from a next adjacent electrode. Thus, a channel defined between adjacent electrodes increases in width from a smaller upstream end 100 to a larger downstream end 101, and such that when a different voltage potential is applied to adjacent electrodes, a dielectrophoretic force on a bubble 40 in the cooling channel 130, 132, 134 will force it towards the larger downstream end 101. Of course, each cooling channel 130, 132 and 134 as disclosed includes sub-channels 60, 61, 63, 65, and 67. At least some adjacent sub-channels (61, 63 and 65) are defined by a common electrode and each between another electrode. Lateral outer ones of the sub-channels 60 and 67 are defined by an electrode (56/66) and an axially extending outer wall 50, which either acts as or contains an electrode.

While the non-parallel electrodes are shown to be linear and straight in FIG. 2, FIG. 3 shows an embodiment where the electrodes 256 and 262 extend to be non-parallel by being curved. In this manner, there is a greater electric field at an end 203 of the channel 202 than would exist at the end 201. This will result in the bubble being urged toward the end 201, as in the prior embodiment.

Electric voltage is provided across the electrodes 50, 56, 62, 64 and 66 from a control and power supply 200, shown schematically in FIG. 2. When a voltage difference is provided between electrodes 56, 62, 64 and 66, and the electrodes in outer wall 50, then a dielectrophoretic force will be created tending to force bubbles 40 generated in each of the sub-channels in the direction where the electrodes are further spaced. Thus, in channels 60, 63 and 67, bubbles 40 move to the left in this figure, while channels 61 and 65 would have bubbles 40 moving to the right. Once the bubbles move into plenums 36 and 38, they move adjacent to the outer walls. Heat transfer fins 54 may be associated with outer walls 52 to assist in dissipating the bubbles, and draining heat outwardly through the outer walls 52 to the environment.

That is, due to the opposed lateral component of the adjacent electrodes, there is a smaller upstream end 100 and a larger downstream end 101. When a voltage difference is supplied between the electrodes 56 and 62, a force will be applied on any bubbles which will tend to force the bubbles toward the larger downstream end 101 where the electric field is weaker.

As a bubble moves outwardly beyond any of the sub-channels, more fluid will move inwardly into the opposed side of the sub-channels. That is, as a bubble 40 moves to the left of, for example, sub-channel 60, more fluid would flow in from the right hand side of the sub-channel 60, and from the plenum 38. Thus, there is constant movement of the fluid into and out of each of the sub-channels.

FIG. 4 shows an alternative embodiment wherein the electrodes 260 and 262 do extend parallel to each other. However, one or both of electrodes 260 and 262 are resistive electrodes, such that the voltage potential of the resistive electrode varies along its length, and the voltage difference between electrodes 260 and 262 at the downstream end 263 is less than at the upstream end 264 such that the electric field in the channel 265 at a downstream end 263 is less than the electric field an upstream end 264. Essentially, control/voltage source 200 applies a different voltage at downstream end 263 than at upstream end 264. The force varies smoothly between the two ends. In this manner, the bubble will be urged, as in the prior embodiment.

FIG. 5 shows yet another embodiment wherein there are segmented electrodes 270 and 271 at a downstream end 280 of a channel 278. Other electrodes 272 and 273 are at the upstream end 281 of the channel 278. The electrodes 272 and 273 are supplied with a greater potential difference between them than the potential difference between electrodes 270 and 271 such that there will be a force urging a bubble in the downstream direction. Of course, more than two segments may be used.

The FIG. 3-5 embodiments, similar to the FIGS. 1 and 2 embodiments, may also be utilized as single or multiple layers, and with multiple sub-channels or as a single channel.

In addition, the embodiments of FIGS. 3-5 would be utilized with plenums as in the embodiments of FIGS. 1 and 2.

As mentioned above, the cooling can be utilized for any of electronic components. Thus, while CPUs are illustrated, other components such as IGBTs, MOSFETs, and any other power electronic component would also benefit from the teaching of this application.

In this manner, the stacked electronic control may be cooled adequately, without the requirement of complex structure.

Although an embodiment of this invention has been disclosed, a worker of ordinary skill in this art would recognize that certain modifications would come within the scope of this invention. For that reason, the following claims should be studied to determine the true scope and content of this invention.

The invention claimed is:

1. An electronic component and cooling system comprising;
   at least one cooling channel positioned adjacent to an electronic component, said at least one cooling channel communicating with plenums at each of two opposed axial ends;
   a dielectric fluid received in said cooling channel; and
   said cooling channel being provided with at least two electrodes, and a voltage potential is applied to each of said at least two electrodes so that an electric field is formed in said cooling channel such that the electric field magnitude at the downstream end of said cooling channel is less than an upstream electric field magnitude, and such that a dielectrophoretic force on a bubble in said cooling channel will force it downstream; and
   at least one of said at least two electrodes are electrically resistive electrodes such that its voltage potential varies along its length to create said downstream force.

2. The system as set forth in claim 1, wherein there are a plurality of electronic components, and a plurality of said at least one cooling channel.

3. An electronic component and cooling system comprising:
   at least one cooling channel positioned adjacent to an electronic component, said at least one cooling channel communicating with plenums at each of two opposed axial ends;
   a dielectric fluid received in said cooling channel; and
   said cooling channel being provided with at least two electrodes, and a voltage potential is applied to each of said at least two electrodes so that an electric field is formed in said cooling channel such that the electric field magnitude at the downstream end of said cooling channel is less than an upstream electric field magnitude, and such that a dielectrophoretic force on a bubble in said cooling channel will force it downstream; and
   said at least two electrodes includes a plurality of segmented electrodes, and a voltage potential variation is provided by differing potential applied to said segments of said electrodes to create said downstream force.

4. A control stack comprising:
   a plurality of generally planar electronic controls stacked in a direction generally perpendicular to their generally planar shape;
   cooling channels positioned intermediate adjacent ones of said plurality of electronic controls, and said cooling channels communicating with plenums at each of two opposed axial ends of said cooling channels;
   a dielectric fluid received in said cooling channels; and
   said cooling channels being provided with a plurality of electrodes, with adjacent ones of said electrodes extending in a non-parallel direction along an axial direction between said plenums, and such that said adjacent electrodes extend in a direction with an axial component, and a lateral component, and with said lateral component from one said adjacent electrode being opposed to a lateral component from a next said adjacent electrode, and such that a channel defined between said adjacent electrodes increases in width from a smaller upstream end to a larger downstream end, and such that when a voltage potential is applied to adjacent electrodes then a dielectrophoretic force on a bubble in said cooling channel will force it towards said larger downstream end.

5. The control stack as set forth in claim 4, wherein said plurality of electrodes extend along a generally linear direction.

6. The control stack as set forth in claim 4, wherein said adjacent ones of said electrodes extend along a curved direction.

7. The control stack as set forth in claim 4, wherein said electronic controls are central processing unit cores.

8. The control stack as set forth in claim 4, wherein heat transfer fins are included in said plenums adjacent outer walls to assist in dissipation of heat from the dielectric liquid to the environment.

9. The control stack as set forth in claim 4, wherein there are a plurality of sub-channels in each of said cooling channels defined by said plurality of electrodes.

10. The control stack as set forth in claim 9, wherein there are laterally adjacent ones of said sub-channels positioned between each of said plurality of electronic controls, and said adjacent ones of said sub-channels forcing bubbles in opposed axial directions, by having said larger downstream ends at opposed ends.

11. The control stack as set forth in claim 10, wherein at least some of said adjacent sub-channels are defined by a common electrode and another of said electrodes.

12. The control stack as set forth in claim 10, wherein there are laterally outer ones of said sub-channels defined by one of said electrodes and an axially extending outer wall.

13. A control stack comprising:
a plurality of generally planar central processing units stacked in a direction generally perpendicular to their generally planar shape;
cooling channels positioned intermediate adjacent ones of said plurality of central processing units, and said cooling channels communicating with plenums at each of two opposed axial ends of said cooling channels;
a dielectric fluid received in said cooling channels;
said cooling channels provided with a plurality of electrodes, with adjacent ones of said electrodes extending in a non-parallel direction along an axial direction between said plenums, and such that said adjacent electrodes extend in a direction with an axial component, and a lateral component, and with said lateral component from one said adjacent electrode being opposed to a lateral component from a next said adjacent electrode, and such that a sub-channel defined between said adjacent electrodes increases in width from a smaller upstream end to a larger downstream end, and such that when a voltage potential is applied to the electrodes then a dielectrophoretic force on a bubble in said cooling channel will force it towards said larger downstream end;
heat transfer fins included in said plenums adjacent outer walls to assist in dissipation of heat from the dielectric liquid to the environment; and
a plurality of sub-channels in each of said cooling channels defined by said plurality of electrodes.

14. The control stack as set forth in claim 13, wherein there are laterally adjacent ones of said sub-channels positioned between each of said plurality of electronic controls, and said adjacent ones of said sub-channels forcing bubbles in opposed axial directions, by having said larger downstream ends at opposed ends.

15. The control stack as set forth in claim 14, wherein at least some of said adjacent sub-channels are defined by a common electrode and another of said electrodes.

16. The control stack as set forth in claim 13 wherein there are laterally outer ones of said sub-channels defined by one of said electrodes and an axially extending outer wall.

17. The control stack as set forth in claim 13, wherein said plurality of electrodes extend along a generally linear direction.

18. The control stack as set forth in claim 13, wherein said adjacent ones of said electrodes extend along a curved direction.

* * * * *